(12) United States Patent
Imbert et al.

(10) Patent No.: US 7,331,794 B2
(45) Date of Patent: Feb. 19, 2008

(54) RECONFIGURABLE INTERCONNECTION DEVICE FOR ELECTRICAL BUNDLES

(75) Inventors: Nicolas Imbert, Chateauroux les Alpes (FR); Charles Chuc, Marseille (FR)

(73) Assignee: Eurocopter, Marignane (FR)

( * ) Notice: Subject to any disclaimer, the term of this patent is extended or adjusted under 35 U.S.C. 154(b) by 0 days.

(21) Appl. No.: 11/440,069

(22) Filed: May 25, 2006

(65) Prior Publication Data

US 2007/0015409 A1   Jan. 18, 2007

(30) Foreign Application Priority Data

May 30, 2005 (FR) .................................. 05 05463

(51) Int. Cl.
*H01R 12/00* (2006.01)

(52) U.S. Cl. ........................................ 439/61; 361/788

(58) Field of Classification Search .................. 439/61, 439/65; 361/788
See application file for complete search history.

(56) References Cited

U.S. PATENT DOCUMENTS

| 5,348,482 | A |  | 9/1994 | Rudy, Jr. et al. |
| 5,930,119 | A |  | 7/1999 | Berding |
| 6,328,572 | B1 | * | 12/2001 | Higashida et al. ............ 439/61 |
| 6,388,895 | B1 | * | 5/2002 | Hsu ........................... 361/829 |
| 6,392,142 | B1 | * | 5/2002 | Uzuka et al. ................ 174/541 |
| 6,422,876 | B1 | * | 7/2002 | Fitzgerald et al. ............ 439/61 |
| 6,504,730 | B1 |  | 1/2003 | Cooney et al. |
| 2003/0049948 | A1 | * | 3/2003 | Kim et al. .................... 439/61 |
| 2004/0161953 | A1 | * | 8/2004 | MacLaren et al. ............ 439/65 |

FOREIGN PATENT DOCUMENTS

| EP | 1221829 | 7/2002 |
| EP | 2822130 | 9/2002 |

* cited by examiner

*Primary Examiner*—Thanh-Tam Le
(74) *Attorney, Agent, or Firm*—Young & Thompson

(57) ABSTRACT

A device (20) for interconnecting electrical bundles, includes a plurality of pluggable connection and cross-connect cards (34 to 38) for the electrical bundles. The device further includes a "main" printed circuit (28, 28*b*) fitted with connectors or slots (29 to 33) designed and arranged to receive the pluggable cards, the printed circuit having a plurality of parallel tracks (46), each enabling two tracks (61 to 63, 68) or tracks starters (70 to 72) provided respectively on two distinct pluggable cards plugged in the connectors of the main printed circuit to be put to the same potential, each of the parallel tracks (46) being in contact with a respective pin (50, 150) of a plurality of connectors of the main printed circuit.

20 Claims, 7 Drawing Sheets

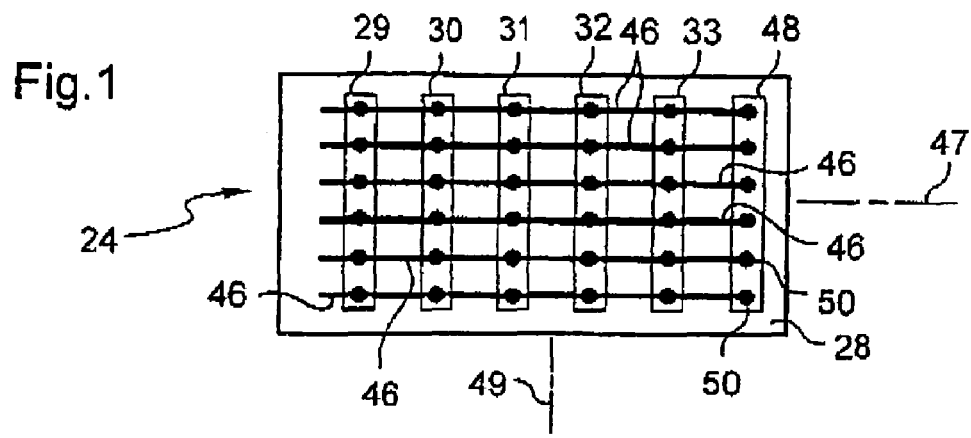
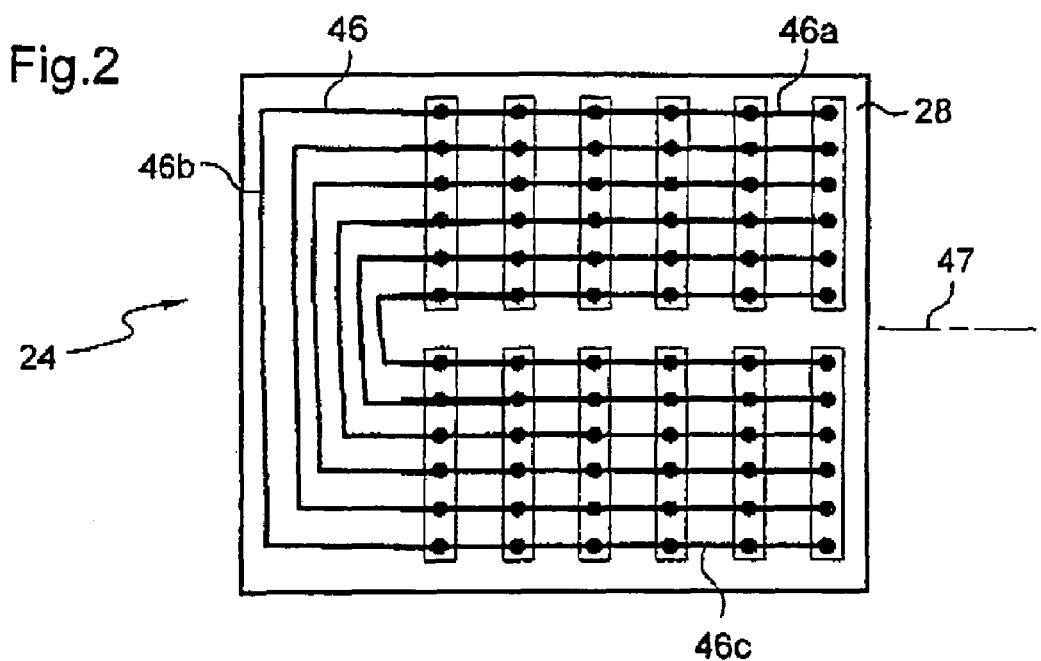
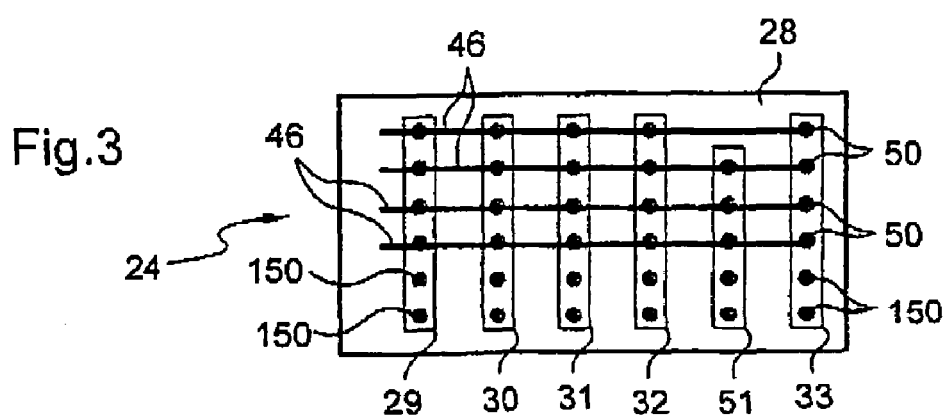

RECONFIGURABLE INTERCONNECTION DEVICE FOR ELECTRICAL BUNDLES

The present invention relates to reconfigurable interconnection devices for electrical bundles, cables, or harnesses.

The technical field of the invention is that of providing connection boxes for electrical bundles in rotary wing aircraft.

BACKGROUND OF THE INVENTION

It is important to be able to adapt (modify) the electrical connections between the pieces of equipment in an aircraft (in particular sensors, actuators, and computers), in particular in order to facilitate installing and maintaining pieces of equipment that are optional.

In order to avoid manufacturing specific bundles or harnesses for each equipment configuration, standard bundles or harnesses are provided, and pieces of equipment are connected using their respective bundles via a bundle interconnection device that is configurable/adaptable to different equipment configurations of the aircraft.

Such a device may include a matrix of pins, in particular a matrix of pins of juxtaposed connectors, together with a plurality of electrically conductive wires, with each wire or "strap" interconnecting two pins. Specifically for reasons of ensuring that pieces of equipment are interchangeable, the pins of the connectors fitted to the bundles or harnesses need not be "associated" with any specific electrical signal. As a result, such devices have large numbers of pins and straps.

The electrical and mechanical connection between the end of a segment of wire or strap and one of the pins of the device can be achieved by wrapping.

Given the high levels of vibration that such connections must be capable of accommodating, and also the necessary level of reliability required for such connections, manual or automatic wrapping of one end of a strap about a pin must be performed with very great precaution and must then be verified.

In addition, the pins or strap ends must be electrically insulated, e.g. by depositing or "impregnating" a layer of insulating plastics material.

In practice, such devices must enable several hundreds of harness conductor wires to be interconnected.

U.S. Pat. No. 5,348,482 describes a bundle junction box comprising a backplane, electronic cards pluggable to the backplane, together with one or more reconfigurable pluggable cards using straps or junctions made by wrapping or by flexible circuits; the backplane is constituted by a wall supporting connectors receiving the pluggable cards, the pins of said connectors being connected by flexible circuits to the pins of inlet/outlet connectors adapted to connectors fitted to harnesses.

Those devices that are reconfigurable by means of straps wrapped onto pins present the drawback of requiring the insulating covering to be removed whenever it is necessary to modify, eliminate, or add a strap; after having modified the straps configuration, a new layer of insulating covering must be deposited, and all of the wrapped connections must be tested anew; such operations are lengthy and expensive.

Proposals have also been made in French patent No. 2,822,130 for an interconnection module comprising a wall, on a first face of which there are provided connectors for connecting with connection cords, and on a second face of which there are provided connectors that receive three types of pluggable card:

cross-connect cards each comprising a printed circuit with tracks for providing terminal-to-terminal connection with connection cords;

connection and cross-connect cards having connectors adapted to the harness end-connectors; and connection and cross-connect cards that can be modified by manually installing straps.

Such a device is not adapted to rotary wing aircraft in which there is no need to connect interconnection modules via identical cords.

OBJECTS AND SUMMARY OP THE INVENTION

An object of the invention is to provide a harness interconnection system that is easily modified and that is compact.

An object of the invention is to provide an electrical bundle interconnection device that is improved and/or that remedies, at least in part, the drawbacks of prior art interconnection devices.

In a first aspect of the invention, there is provided an electrical bundle interconnection device comprising a plurality of pluggable connection and cross-connect cards for electrical bundles; the device further comprises a "main" (or "distribution") printed circuit fitted with connectors or slots designed and arranged to receive the pluggable cards, the printed circuit having a plurality of parallel insulated (distribution) tracks each enabling two tracks or track starters provided respectively on two distinct pluggable cards to be put to the same potential.

Each connection and cross-connect card includes (or is secured to) an inlet/outlet connector adapted to an end connector of one of the bundles that is to be connected.

Preferably, the connectors fitted to the printed circuit and receiving the connection and cross-connect cards comprise at least one row (e.g. four rows) of pins extending transversely (preferably perpendicularly) relative to the distribution tracks of the printed circuit; at least some of the pins are in contact with corresponding ones of the distribution tracks.

Also preferably, the distribution tracks are distributed over a plurality of layers of the printed circuit, preferably over four or more layers for use in a helicopter or other aircraft; under such circumstances in particular, the printed circuit has several tens or hundreds of parallel distribution tracks.

Each connection and cross-connect card has two edges that are preferably opposite and substantially parallel: a first edge whereby the card is connected, plugged, or inserted in one of the connectors or slots of the printed circuit, and a second edge distinct from the first edge whereby the card is connected to or includes at least one inlet/outlet connector adapted to a bundle end connector.

Each of these cards also generally includes a plurality of branching connection tracks connecting the first edge to the second edge generally associated with a plurality of track starters or cross-connect tracks interconnecting at least two distinct points or zones of the first edge.

In order to make the device even easier to modify, each of the connection tracks includes or is in contact with at least one and preferably two branch connection members such as a pin or an enlarged portion of track (e.g. in the form of a pad).

According to other preferred characteristics of the invention, the parallel tracks of the main printed circuit are insulated from one another, rectilinear, and identical in section.

According to another aspect of the invention, a device is provided for connecting electrical bundles fitted with terminal connectors, the device comprising:

- a main printed circuit or backplane fitted with a plurality of connectors; and
- a plurality of secondary printed circuits or daughter cards, each of which circuits or cards is plugged or pluggable in a connector of the main printed circuit and is connected to or includes a connector that is complementary to a bundle terminal connector.

The main printed circuit comprises a plurality of parallel tracks, each of the tracks being in contact with a respective pin of a plurality of connectors of the main printed circuit so as to interconnect, i.e. maintain at the same potential, two tracks or track starters on two respective secondary printed circuits plugged (or inserted) in two distinct connectors secured to the main printed circuit.

In a preferred embodiment, each of the parallel tracks of the main printed circuit is in contact with a respective pin of each of the connectors fitted to the main printed circuit.

Under such circumstances, the main printed circuit or backplane has an array of parallel tracks of substantially the same length extending from one end to the other of the group of backplane connectors that extend parallel to one another and form a row of connectors.

Also preferably, the connectors are straight, substantially identical, and each of them has at least one row (e.g. four rows) of pins.

In a particular embodiment, each pin of one of the connectors is in contact with a track or a track starter of the daughter card it receives.

In a preferred embodiment, the tracks of a secondary printed circuit are distributed over a plurality of layers, and in particular over two layers.

BRIEF DESCRIPTION OF THE DRAWINGS

Other characteristics and advantages of the invention appear from the following description which refers to the accompanying drawings that show preferred embodiments of the invention without any limiting character.

FIG. 1 is a diagrammatic plan view of a backplane in a first embodiment of a device of the invention.

FIG. 2 is a diagrammatic plan view of a backplane in a second embodiment of a device of the invention.

FIG. 3 is a diagrammatic plan view of a backplane in a third embodiment of a device of the invention.

FIG. 4 is a diagrammatic longitudinal section view of the printed circuit fitted with five connectors; FIG. 5 is a diagrammatic perspective view of the printed circuit showing the locations of the connectors.

FIGS. 7 to 9 are respectively a bottom view, a side view, and a top view of a junction box fitted with ten connectors that are complementary to the terminal connectors (not shown) of bundles for connection by the device; FIG. 10 is an exploded perspective view showing diagrammatically how the main elements of the box are assembled mechanically.

MORE DETAILED DESCRIPTION

With reference to FIGS. 7 to 10 in particular, the device 20 comprises a generally rectangular box 21 having a bottom wall 22 pierced by five openings 23.

Figure 8:
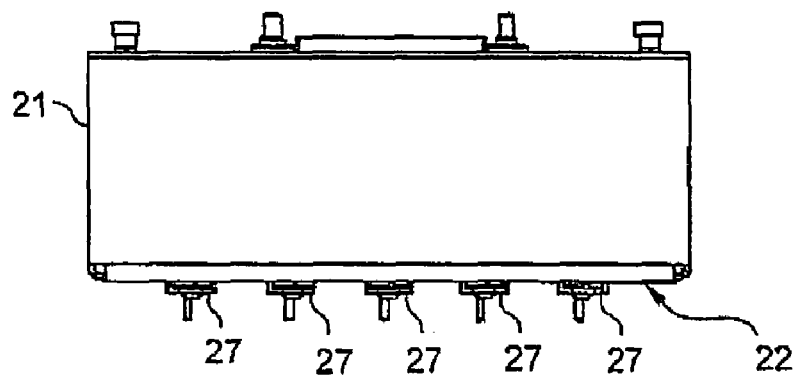
Figure 9:
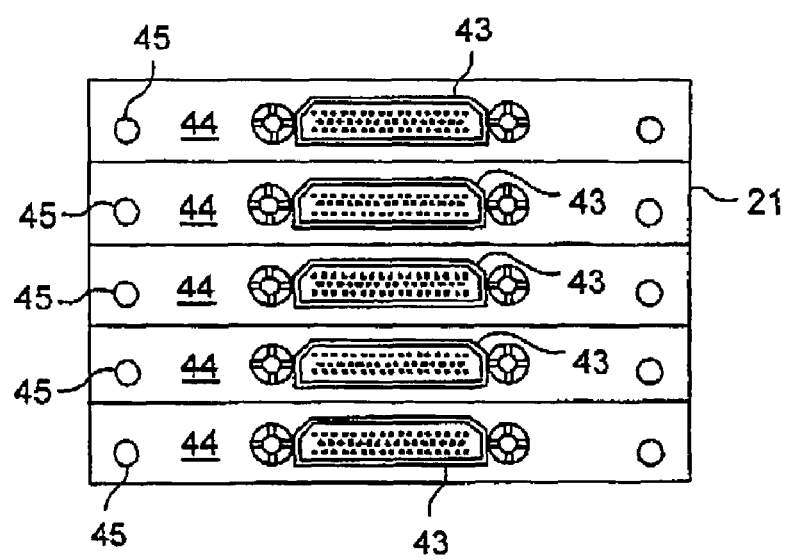

The device further comprises a backplane 24 and a cross-connect circuit 25 which are interconnected by a ribbon cable 26. Five identical connectors 27 are mounted on the bottom face of the circuit 25; these connectors are for co-operating with terminal connectors (not shown) of bundles for connection by the device 20; the openings 23 are of shape that matches the shape of the connectors 27 which, in the assembled position, extend through the openings and project from the bottom of the box, as shown in FIG. 8 in particular.

With reference to FIGS. 4, 6, 10, and 12, in particular, the backplane 24 comprises a main printed circuit 28 having connectors 29 to 33 (FIGS. 4 and 10) secured to a top face thereof and designed to receive (in releasable manner) a corresponding number of secondary printed circuits or "daughter" cards 34 to 38.

Figure 10:
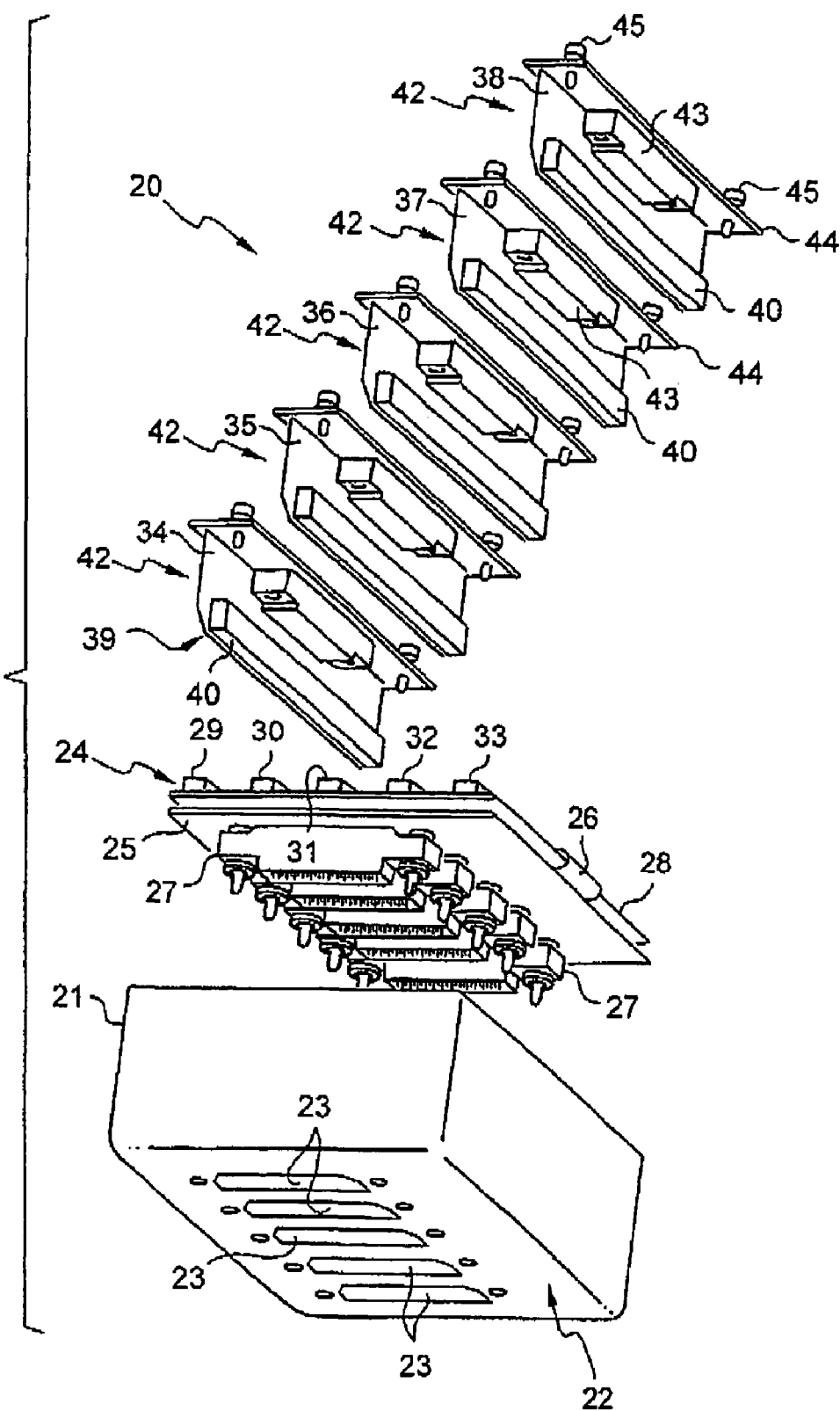

The mechanical and electrical connection for each of the daughter cards with the corresponding backplane connector can be achieved by plugging or insertion; a first example of plugging is shown in FIG. 10 where each daughter card, such as the card referenced 34, is provided along its bottom edge 39 with a connector 40 selected so as to be capable of plug engagement with a corresponding connector 29 of the backplane 24.

Figure 13:
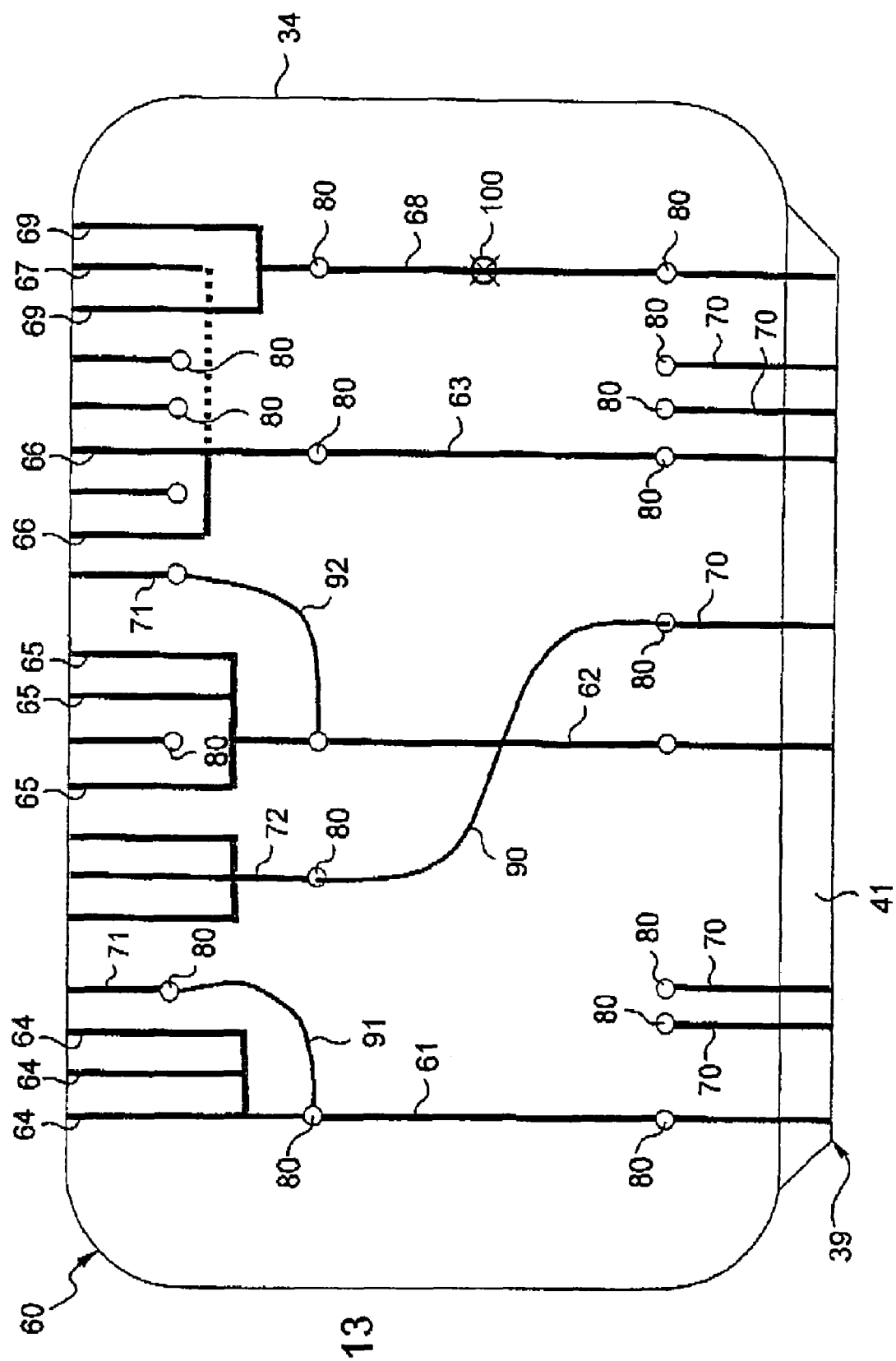
FIG. 13 is a diagrammatic plan view of a secondary printed circuit of an appliance of the invention.

A second example of insertion is shown in FIG. 13, where a card 34 presents a portion 41 extending from the bottom edge 39 of the card, the shape and the dimensions of said portion being matched to the shape and dimensions of a slot provided in each connector of the backplane, which connectors are adapted to receive said portion snugly.

In the embodiment of FIGS. 7 to 10, each daughter card forms part of a module 42 that is removable from the device; in addition to the cards 34 to 38 and their associated connectors 40 for connection with the backplane each module 42 includes a mounting plate 44 and an inlet/outlet connector 43 extending through the corresponding plate. The plate 44 serves to secure the module 42 of which it forms a part to the box 21 by means of two screws 45. Each daughter card 34 has tracks as shown in FIG. 13; the pins of the connector 40 (where a connector is provided) are in contact with the ends of the tracks on the card; the same applies to the pins of the inlet/outlet connector 43 which is complementary to a terminal connector (not shown) of a bundle for connection to the device.

The main printed circuit 28 in FIG. 1 has six rectilinear tracks 46 that are regularly spaced apart from one another, all being of the same length and the same section, extending along an axis 47; the circuit 28 receives six connectors 29 to 33 and 48 that are likewise regularly spaced apart, of the same length, and extend parallel to an axis 49 orthogonal to the axis 47. Each of these connectors has six identical pins 50 regularly spaced apart at a pitch identical to the facing pitch of the tracks 46 along the axis 49; all of the pins of each connector come into contact with a respective track 46, each track 46 thus serving to provide an equipotential connection between the corresponding pins of the six connectors 29 to 33.

In the variant shown in FIG. 3, one of the connectors 51 of the backplane 24 presents one pin fewer than the other connectors 29 to 33; in addition, two pins 150 of each of the connectors 29 to 33 and 51 are not connected to tracks in the array of four parallel tracks 46, unlike the other pins 50 of the connectors.

In the variant shown in FIG. 2, each track 46 has two rectilinear portions 46a and 46c parallel to the axis 47, together with a portion 46b interconnecting the portions 46a and 46c. In general, the tracks 46 form an array of parallel and non-branching equipotentials interconnecting (pin to pin) the connectors 29 to 33 and 51 of the backplane that are for receiving the daughter cards.

In the embodiments shown in FIGS. 4, 5, and 10 to 12, the inlet/outlet (signal transport) connectors form two distinct groups:
  a first group of five connectors 27 secured and connected to a printed circuit 25; and
  a second group of five connectors 43 respectively secured to the printed circuit 28 by the cards 34 to 38.

The circuits 25 and 28 are disposed facing each other and are interconnected by the ribbon 26.

This configuration can be used, for example, by connecting to the connectors 27 of the device 20 the bundles (not shown) of pieces of equipment and apparatuses that are standard on board an aircraft, and by connecting the bundles (not shown) of pieces of equipment that are optional to the connectors 43 of the daughter cards; under such circumstances in particular, the printed circuit 25 may be designed to provide cross-connections between the signals carried by the standard equipment bundles, while the circuit 28 is designed firstly to share signals between the optional equipments, via the array of parallel tracks, and secondly to distribute (share) signals between the optional equipments and the standard equipments.

Figure 4:
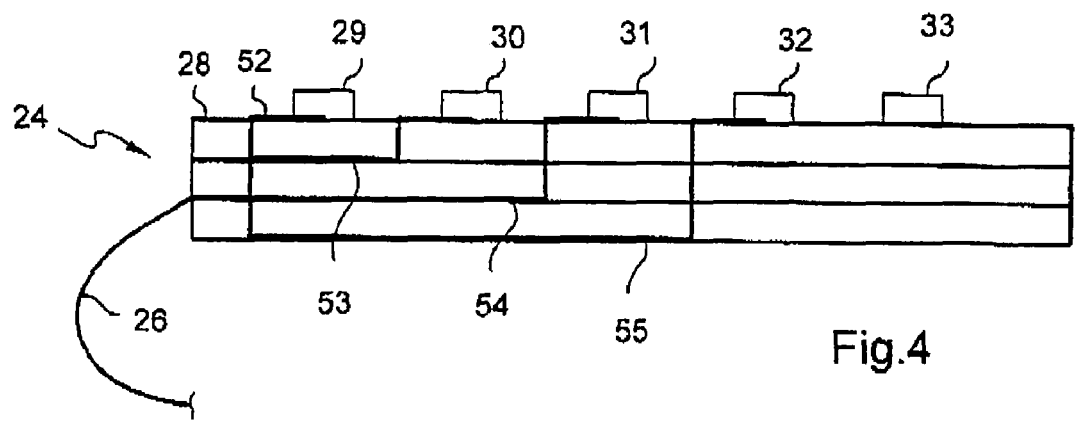
FIGS. 4 and 5 show a four-layer main printed circuit connected to a flexible connection circuit.
Figure 5:
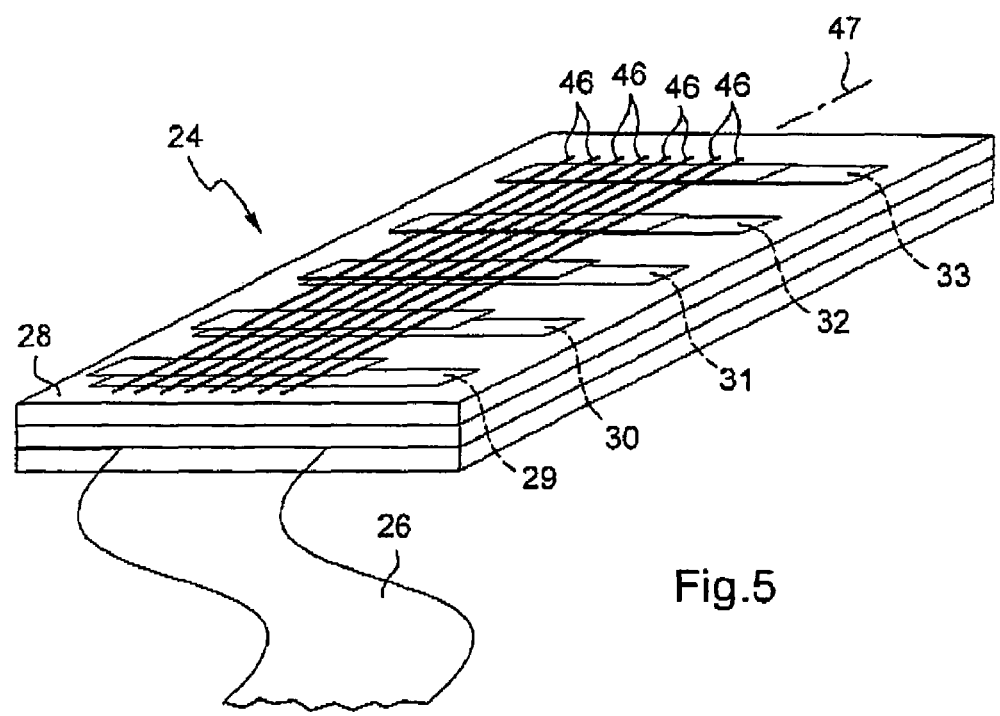
Figure 11:
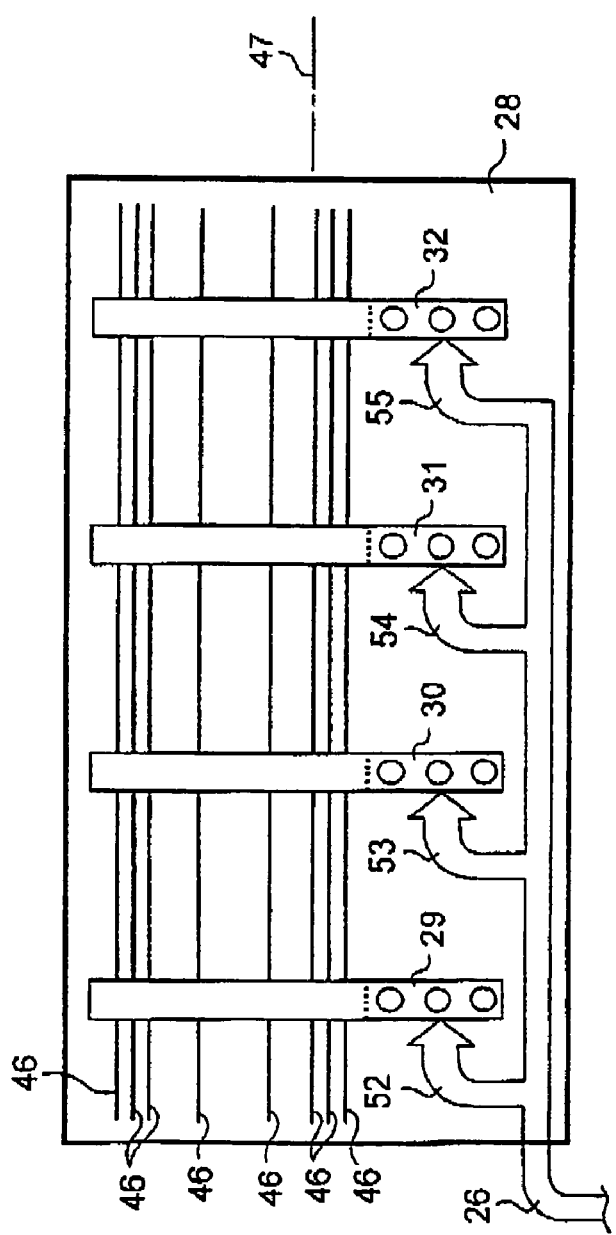
FIG. 11 is a diagrammatic plan view of the backplane circuit of FIG. 12.
Figure 12:
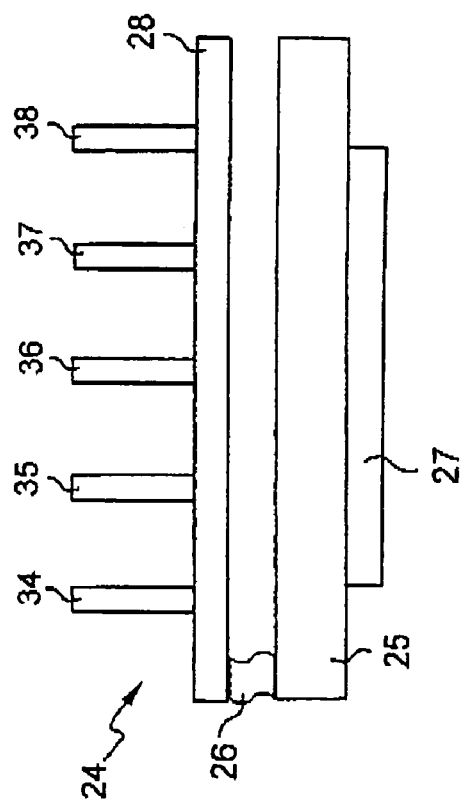
FIG. 12 is a diagrammatic side view of a backplane receiving five daughter cards and connected to a cross-connect circuit by a ribbon cable, like the device in FIG. 10.

In this configuration shown in FIGS. 4, 5 and 11, the array of parallel equipotential tracks 46 occupies a first portion of the circuit 28, while other tracks connect certain pins of the connectors 29 to 32 of the backplane to conductors of the ribbon cable 26:
  a first group of tracks 52 connects the connector 29 to the ribbon 26;
  a second group of tracks 53 connects the connector 30 to the ribbon 26;
  a third group of tracks 54 connects the connector 31 to the ribbon 26; and
  a fourth group of tracks 55 connects the connector 32 to the ribbon 26.

As shown in FIG. 4, these tracks 52 to 55 are distributed over four superposed layers of the circuit 28.

With a backplane corresponding to 144-pin connectors (referenced 29 to 33, 51) it is possible for example to connect about two-thirds of the pins (e.g. 100 pins) of each connector to the tracks (e.g. 100 tracks) 46 of the equipotential array, and to connect the remainder (about one-third) of the pins of each connector to conductors of the ribbon cable 26 connecting with the cross-connect circuit 25 for the inlet/outlet signals (presented on the pins of the connectors 27).

Figure 6:
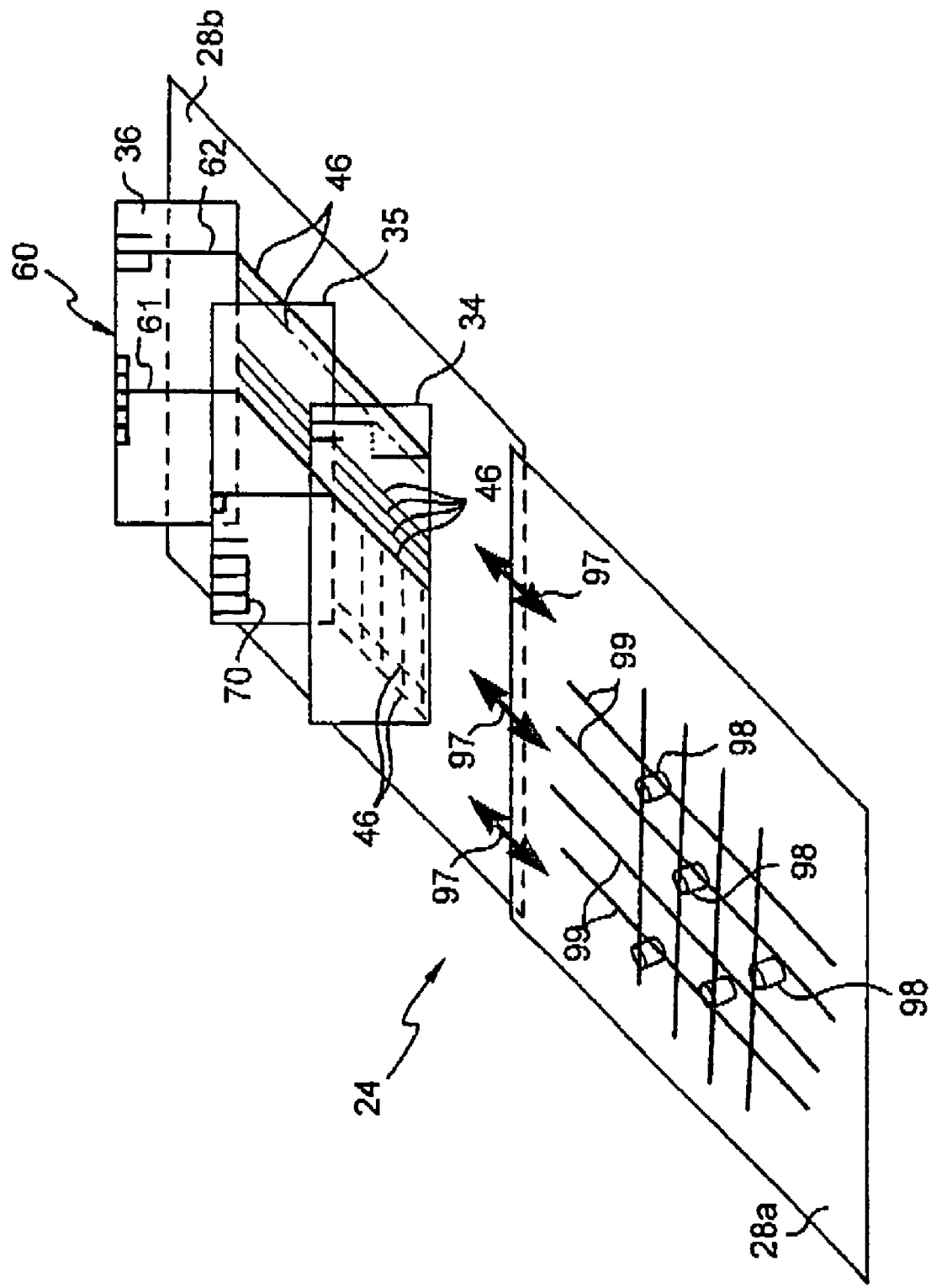
FIG. 6 is a diagrammatic perspective view of a portion of a system in another embodiment of the invention that comprises a main printed circuit, three daughter cards, and an additional cross-connect circuit.
Figure 7:
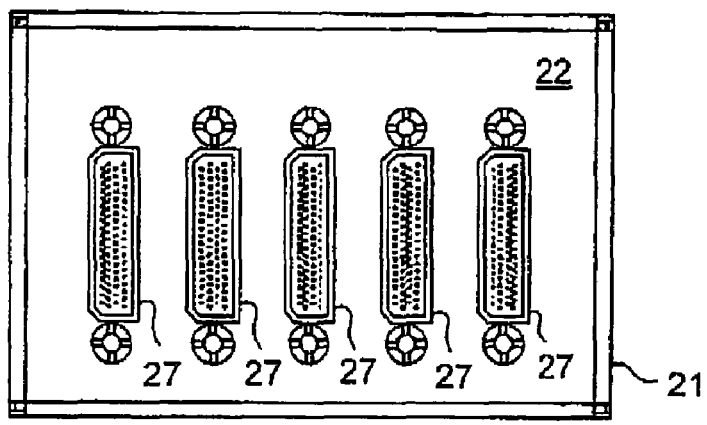
FIGS. 7 to 10 show a preferred embodiment of a device of the invention.

With reference to FIGS. 6 and 13 in particular, each card 34 has a plurality of branching tracks extending between its edge 39 for insertion into a slot of the backplane, and its opposite edge 60.

With reference to FIG. 13 in particular, each of the tracks 61 to 63 presents a "trunk" extending from the edge 39 towards the opposite edge 60, together with three "branches" 64 to 67 extending from the "trunk" to the edge 60.

Similarly, the track 68 comprises a trunk that is extended by only two branches 69.

The track 63 has two of its branches referenced 66 extending on a first face or layer of the circuit 34, while its third branch 67 extends on a second face or layer of the circuit 34.

Each of these branching tracks serves to put to a common potential at least two pins of a first connector (such as one of the connectors referenced 43 in FIG. 10) that is fixed or inserted along the edge 60 of the card 34, together with a pin of a connector fixed along or receiving the edge 39 of the card 34.

The circuit 34 also has a plurality of track starters (70 to 72) some extending from the edge 39 and others extending from the edge 60 opposite the edge 39, but without reaching the opposite edge; each of these track starters is terminated by an enlarged portion 80 forming a disk or "pad"; each of the tracks 61 to 63 and 68 also has two such enlarged portions or pads.

The tracks and their pads are normally covered in insulation, in particular an electrically insulting covering or film.

After having their insulating covering removed, the enlarged portions 80 make it possible to establish a connection or "strap" between two tracks or track starters of the card 34 by soldering the ends of a segment (90 to 92) of conductive wire to the corresponding pads; in particular, in FIG. 13, there can be seen a strap 90 connecting the pad 80 of a non-branching track starter 70 to the pad 80 of a branching track starter 72; the same applies for the straps 91 and 92.

Thus, the two enlarged portions 80 provided on each of the long/complete tracks 61 to 63, 68—which extend from one of the card edges to the opposite edge—and the enlarged portion 80 provided on each of the track parts/starters make it easier to modify the cross-connect configuration of each daughter card 34 by installing suitable straps.

It will also be understood that using such daughter cards with a backplane, itself provided with an array of equipotential tracks (some of which may be unused, i.e. not connected to any of the pins of any of the inlet/outlet connectors), makes it easier to modify and maintain the device 20 for cross-connecting electrical bundles. On this topic, it may be observed that a track such as the track 68 in FIG. 13 can be transformed quickly into two isolated track starters by destroying a portion 100 of the track situated between the two enlarged portions 80 (e.g. by drilling a hole).

In a variant, the enlarged portions 80 may be replaced by male equipotential connection members (such as pins or studs) or female connection members (such as clamps) of shape complementary to connection members fitted to the ends of the strap wire segments.

In a system of the invention, a daughter card can be modified, added, or removed in a manner that is simple and fast; in addition, at least one free slot can be provided in the backplane for temporarily receiving a card that is specially designed for maintenance or diagnosis of the bundles and/or equipments interconnected by the device 20.

In the embodiment shown in FIG. 6, the main printed circuit 28 has a first portion 28b fitted with an array of parallel equipotentials 46 connecting together connectors that receive daughter cards 34 to 36, and a second portion 28a fitted with inlet/outlet connectors (not shown); cross-connection is provided by straps connecting pins 98 of the circuit 28a, and connections 97 for connecting some of the tracks 99 of the portion 28a to the equipotentials 46 of the portion 28b.

What is claimed is:

1. A device (20) for interconnecting electrical bundles, the device comprising:
   a plurality of pluggable cards (34 to 38) for connecting and cross-connecting electrical bundles;
   a track element included on each pluggable card, the track element being one of a track and a track starter;
   a main printed circuit (28, 28b);
   connectors (29 to 33) fitted on the main printed circuit and designed and arranged to receive the pluggable cards; and
   several tens of parallel tracks (46) on the main printed circuit,
   each parallel track putting the track element of one of the pluggable cards plugged into one of the connectors, and the track element of another of the pluggable cards plugged into another of the connectors to a common potential,
   the each parallel track (46) being in contact with a respective pin (50, 150) in at least two of the connectors.

2. A device according to claim 1, in which the each pluggable card (i) includes an inlet/outlet connector (43) adapted to an end connector of a bundle for connection, or (ii) is secured to an inlet/outlet connector (43) adapted to an end connector of a bundle for connection.

3. A device according to claim 1, in which the connectors (29 to 33) of the main printed circuit include at least one row of pins (50, 150) extending transversely to the parallel tracks (46) of the printed circuit, and in which at least some of said pins are in contact with a respective one of the parallel tracks.

4. A device according to claim 1, in which the parallel tracks (46) are distributed in a plurality of layers of the main printed circuit (28, 28b).

5. A device according to claim 1, in which the main printed circuit comprises several hundreds of non-branching parallel tracks (46).

6. A device according to claim 1, in which the each pluggable card has two edges that are preferably opposite and substantially parallel: a first edge (39) whereby the card is one of connected, plugged, and inserted in one of the connectors of the main printed circuit; and a second edge (60) distinct from the first edge whereby the card (i) is connected to at least one inlet/outlet connector adapted to an end connector of a bundle, or (ii) includes at least one inlet/outlet connector adapted to an end connector of a bundle.

7. A device according to claim 6, in which the each pluggable card has a plurality of branching connection tracks (61 to 63, 68) connecting the first edge to the second edge, together with a plurality of track starters (70 to 72) or cross-connect tracks suitable for interconnecting at least two distinct points (or zones) of the first edge.

8. A device according to claim 1, in which each track (61 to 63, 68) (i) includes two branch connection members (80) such as a pin, a wide portion of track, a pad, or a clamp, or (ii) is in contact with two branch connection members (80) such as a pin, a wide portion of track, a pad, or a clamp.

9. A device according to claim 1, in which the parallel tracks (46) of the main printed circuit are insulated from one another, rectilinear, and of identical section.

10. A device according to claim 1, in which the each of the parallel tracks (46) of the main printed circuit (28, 28b) is in contact with a respective pin (50, 150) of each of the connectors.

11. A device according to claim 1, in which the main printed circuit includes an array of the parallel tracks (46) having substantially the same length and extending from a first end of a row of connectors (29 to 33) to an opposite of end of the row of connectors, wherein the connectors extend parallel to one another.

12. A device according to claim 1, in which the connectors (29 to 33) are straight, substantially identical, and each includes at least one row of pins (50, 150).

13. A device according to claim 1, in which each pin of one of the connectors (29 to 33) is in contact with a track or a track starter of the pluggable card it receives.

14. A device according to claim 1, in which the tracks (61 to 63, 68) or track starters (70 to 72) of a pluggable card are distributed in a plurality of layers.

15. A device (20) for interconnecting electrical bundles, the device comprising:
   a plurality of pluggable cards (34 to 38) for connecting and cross-connecting electrical bundles,
   each pluggable card having track starters (70 to 72) extending from a first edge of the card and terminating prior to a second, opposite end of the card,
   the each pluggable card further having tracks (61 to 63, 68) extending from the first edge of the card to the second edge of the card; and
   a backplane (28, 28b) fitted with connectors (29 to 33) arranged to receive the pluggable cards at the first edge,
   the backplane having several tens of parallel distribution tracks (46),
   each distribution track putting one of a track and a track starter on a first pluggable card and one of a track and a track started on a second pluggable card, to a common potential,
   the first and second pluggable cards being plugged into respective ones of the connectors, and
   each of the distribution tracks (46) being in contact with a respective pin (50, 150) in at least two of the connectors.

16. A device according to claim 15, in which the backplane connectors (29 to 33) receiving the pluggable cards include at least one row of pins (50, 150) extending transversely to the distribution tracks (46), and in which at least some of said pins are in contact with a respective one of the distribution tracks.

17. A device according to claim 16, in which the backplane comprises several hundreds of parallel non-branching distribution tracks (46).

18. A device according to claim 17, in which the each pluggable card has
   a first edge (39) whereby the card is one of connected, plugged, and inserted in one of the backplane connectors; and
   a second edge (60) whereby the card can (i) be connected to at least one inlet/outlet connector adapted to an end connector of a bundle, or (ii) include at least one inlet/outlet connector adapted to an end connector of a bundle.

19. A device according to claim 17, in which the each pluggable card has a plurality of branching connection tracks (61 to 63, 68) extending from a first edge of the card to a second edge of the card, together with a plurality of track starters (70 to 72) or cross-connect tracks suitable for interconnecting at least two distinct zones of the same card edge.

20. A device according to claim 19, in which each connection track (61 to 63, 68) (i) includes two branch connection members (80), or (ii) is in contact with two branch connection members (80).

* * * * *